US008543955B1

(12) United States Patent  
Kaptanoglu et al.

(10) Patent No.: US 8,543,955 B1  
(45) Date of Patent: Sep. 24, 2013

(54) APPARATUS AND METHODS FOR TIME-MULTIPLEX FIELD-PROGRAMMABLE GATE ARRAYS

(75) Inventors: Sinan Kaptanoglu, Belmont, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 312 days.

(21) Appl. No.: 12/716,999

(22) Filed: Mar. 3, 2010

Related U.S. Application Data

(62) Division of application No. 10/941,369, filed on Sep. 15, 2004, now abandoned.

(51) Int. Cl.  
*G06F 17/50* (2006.01)

(52) U.S. Cl.  
USPC .......................................... 716/116; 716/117

(58) Field of Classification Search  
USPC .................................. 716/116, 117  
See application file for complete search history.

(56) References Cited

U.S. PATENT DOCUMENTS

2002/0010853 A1* 1/2002 Trimberger et al. .............. 713/1

OTHER PUBLICATIONS

Trimberger et al.; "Scheduling Designs into a Time-Multiplexed FPGA"; 1998; IEEE; All Pages.*  
Andersson et al.; "Performance Oriented Partitioning for Time-Multiplexed FPGA's"; 2000; IEEE; All Pages.*

* cited by examiner

*Primary Examiner* — Suresh Memula  
(74) *Attorney, Agent, or Firm* — Law Office of Maximilian R. Peterson

(57) ABSTRACT

A time-multiplexed field programmable gate array (TM-FPGA) includes programmable logic circuitry, programmable interconnect circuitry, and a plurality of context registers. A user's circuit can be mapped to the programmable logic circuitry, the programmable interconnect circuitry, and the plurality of context registers without the user's intervention in mapping the design.

20 Claims, 16 Drawing Sheets

US 8,543,955 B1

APPARATUS AND METHODS FOR TIME-MULTIPLEX FIELD-PROGRAMMABLE GATE ARRAYS

CROSS-REFERENCE TO RELATED APPLICATIONS

This application is a divisional of U.S. patent application Ser. No. 10/941,369, filed on Sep. 15, 2004, now abandoned titled 'Apparatus and Methods for Time-Multiplex Field-Programmable Gate Arrays,' which is hereby incorporated by reference in its entirety.

TECHNICAL FIELD

The inventive concepts relate generally to programmable or configurable circuitry and, more particularly, to apparatus and methods for time-multiplexed (TM) field-programmable gate arrays (FPGAs), or TM-FPGAs, and related design flows and computer-aided design (CAD) methodology.

BACKGROUND

FPGAs allow circuit designers to prototype relatively complex designs before finalizing the design. Compared to application specific integrated circuits (ASICs), FPGAs provide designers the flexibility of revising or refining their designs in their laboratories without having a full-blown fabrication of each iteration or revision to the design. Because of their flexibility and programmability, however, typical FPGAs may not contain enough hardware resources to implement or emulate relatively complex designs.

TM-FPGAs seek to re-use the FPGA's hardware. Thus, they provide the designer with apparent increased hardware resources (in exchange for slower operating speed). As a result, designers may implement larger designs than ordinary FPGAs would allow. To use conventional TM-FPGAs advantageously, however, designers should have knowledge of the time-multiplexed nature of the FPGA. Thus, the user has involvement in the process of implementing the design in the TM-FPGAs and often has to make decisions about various aspects of that process. A need therefore exists for TM-FPGAs that allow implementation of a user's design without the user's extensive involvement in that process.

SUMMARY

The inventive concepts contemplate novel TM-FPGAs. One aspect of the invention relates to TM-FPGA apparatus. In one embodiment, a TM-FPGA includes a plurality of programmable logic circuits and programmable interconnect circuitry. Each programmable logic circuit has at least one context register. A user's circuit can be mapped to the plurality of programmable logic circuits and the programmable interconnect circuitry without the user's intervention in mapping the circuit to the context register(s).

In another embodiment, a TM-FPGA includes a plurality of programmable logic circuits. Each programmable logic circuit includes a set of r context registers. The context registers are configured according to r×N bits of configuration data, where N≥r and r≥1. Furthermore, r has an average value of k contexts registers per programmable logic circuit, where k≤N.

Another aspect of the invention relates to methods of using TM-FPGAs to realize or implement a desired electronic circuit. In one embodiment, a method of implementing an electronic circuit using a TM-FPGA includes obtaining a design of the electronic circuit design from a user. The method further includes mapping the electronic circuit to resources within the TM-FPGA) without the user's intervention, and programming the TM-FPGA accordingly.

In another embodiment, a method of processing an electronic circuit design includes obtaining the electronic circuit design from a user, and mapping automatically the electronic circuit design to resources within a TM-FPGA.

In a third embodiment, a method of mapping an electronic circuit to resources in a TM-FPGA includes obtaining a representation of the electronic circuit from a user, and automatically partitioning the electronic circuit into a plurality of clusters. The method further includes automatically assigning each cluster in the plurality of clusters to a context of the time-multiplexed field programmable gate array (TM-FPGA).

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for novel TM-FPGAs and related design flows and CAD methodology. With the disclosed novel TM-FPGAs, other than the clocking arrangement, the user need not target his or her design specifically for a TM-FPGA.

The disclosed TM-FPGAs provide many advantages over previously proposed TM-FPGAs. First, they are suitable for general-purpose applications, rather than niche applications that use re-configurable computing. Second, with the disclosed TM-FPGAs, design flow, and CAD methodology, the user does not have to intervene in the design process as is the case with conventional TM-FPGAs. This property of the disclosed TM-FPGAs makes them suitable for mainstream use and applications by typical users, rather than users that have specialized knowledge.

Third, TM-FPGAs according to the invention provide more efficient solutions. More specifically, they can provide die area savings (typically, a factor of two or more) over conventional FPGAs. Fourth, one may use the disclosed TM-FPGAs for prototyping structured ASICs. As long as one matches input/output (I/O) connections between the two approaches, one may use the time-multiplexed nature of the TM-FPGAs to prototype structured ASICs. The time-multiplexed nature of the TM-FPGA allows prototyping a relatively large structured ASIC product.

Fifth, because the user need not know about the time-multiplexed nature of the FPGA, the user may use the TM-FPGA more easily to implement his or her designs. Sixth, the disclosed novel TM-FPGAs overcome the glitch restrictions associated with conventional TM-FPGAs. Other benefits and advantages of the novel TM-FPGAs become apparent in to persons of ordinary skill in the art in the rest of the description.

Figure 1:
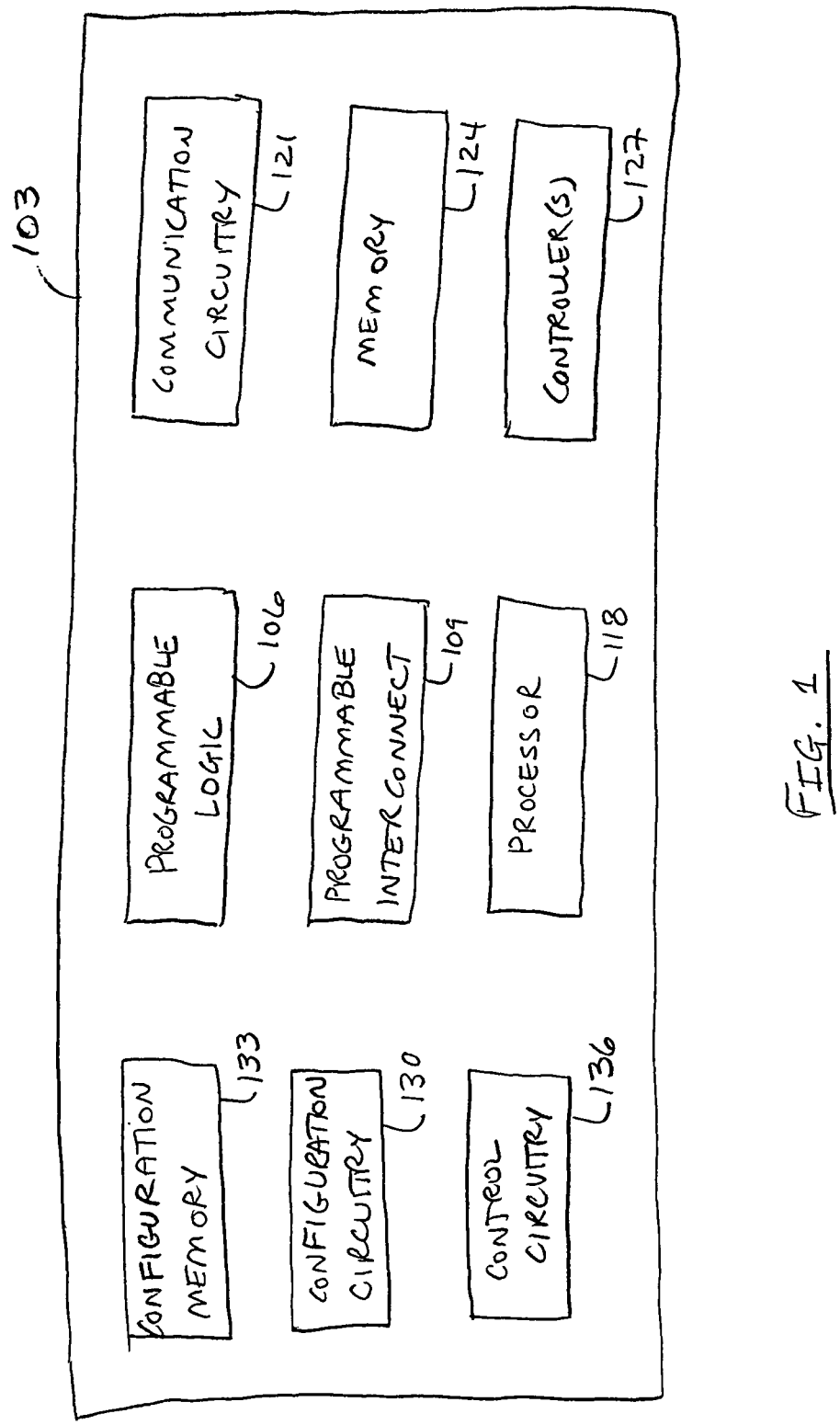
FIG. 1 shows a general block diagram of a TM-FPGA according to an illustrative embodiment of the invention.

FIG. 1 shows a general block diagram of a TM-FPGA 103 according to an illustrative embodiment of the invention. TM-FPGA 103 includes configuration circuitry 130, configuration memory 133 (also known as configuration random-access memory, or CRAM), control circuitry 136, programmable logic 106, and programmable interconnect 109. In addition, TM-FPGA 103 may include one or more processors 118, one or more communication circuitry 121, one or more memories 124, one or more controllers 127, as desired. The user may implement a design using the various resources of the TM-FPGA, such as programmable logic 106, programmable interconnect 109, etc.

Note that FIG. 1 shows a simplified block diagram of TM-FPGA 103. Thus, TM-FPGA 103 may include other blocks and circuitry, as persons of ordinary skill in the art understand. Examples of such circuitry include clock generation and distribution circuits, redundancy circuits, test/debug circuits, and the like. Furthermore, TM-FPGA 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers, logic gates, registers, memory, and the like. Persons of ordinary skill in the art may recognize the blocks of configurable or programmable logic by various names, such as logic elements (LEs), logic cells (LCs), macro-cells (MCs or MCells), adaptive logic modules (ALMs) and adaptive look-up tables (ALUTs), etc.

Compared to conventional circuits, the configurable or programmable logic blocks include additional circuitry to provide the time-multiplexed feature of the disclosed TM-FPGAs, as described below in detail.

Programmable interconnect 109 couples to programmable logic 106. Programmable interconnect 109 provides configurable interconnects (coupling mechanisms) between various blocks within programmable logic 106 and other circuitry within or outside TM-FPGA 103.

Configuration memory 133 stores configuration data for TM-FPGA 103. Configuration memory 133 may obtain the configuration data from an external source, such as a storage device, a host, etc. Control circuitry 136 controls various operations within TM-FPGA 103. Under the supervision of control circuitry 136, TM-FPGA configuration circuitry 130 uses configuration data from configuration memory 133 to program or configure the functionality of TM-FPGA 103. The configuration data determine the functionality of TM-FPGA 103 by programming the configurable resources of TM-FPGA 103, such as programmable logic 106 and programmable interconnect 109, as persons skilled in the art with the benefit of the description of the invention understand.

As noted above, TM-FPGA 103 may include one or more processors 118. Processor 118 may couple to other blocks and circuits within TM-FPGA 103. Processor 118 may receive data and information from circuits within or external to TM-FPGA 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

TM-FPGA 103 may also include one or more communication circuitry 121. Communication circuitry 121 may facilitate data and information exchange between various circuits within TM-FPGA 103 and circuits external to TM-FPGA 103, as persons of ordinary skill in the art who have the benefit of the description of the invention understand. As an example, communication circuitry 121 may provide various protocol functionality (e.g., Transmission Control Protocol/Internet Protocol (TCP/IP), User Datagram Protocol (UDP) etc.), as desired. As another example, communication circuitry 121 may include network (e.g., Ethernet, token ring, etc.) or bus interface circuitry, as desired.

TM-FPGA 103 may further include one or more memories 124 and one or more controller(s) 127. Memory 124 allows the storage of various data and information (such as user-data, intermediate results, calculation results, etc.) within TM-FPGA 103. Memory 124 may have a granular or block form, as desired. Controller 127 allows interfacing to, and controlling the operation and various functions of circuitry outside the TM-FPGA. For example, controller 127 may constitute a memory controller that interfaces to and controls an external synchronous dynamic random access memory (SDRAM), as desired.

Figure 2:
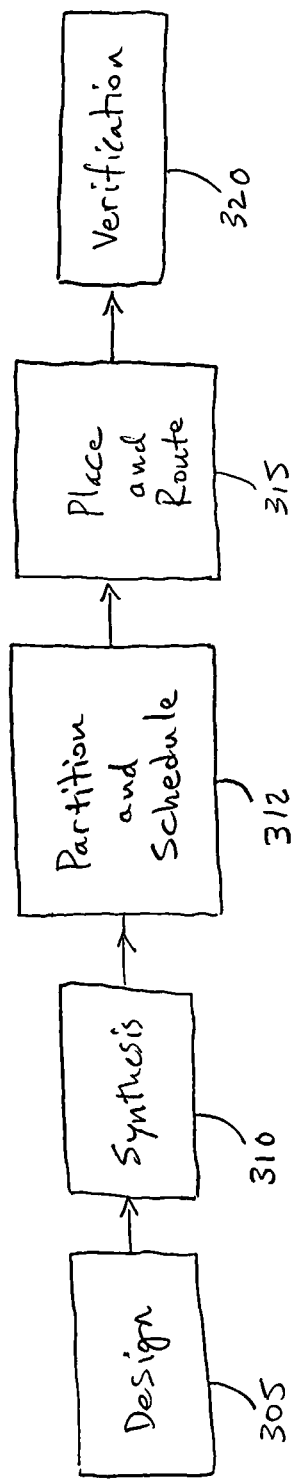
FIG. 2 illustrates various software modules that TM-FPGA CAD software according to illustrative embodiments of the invention uses.

The user invokes a CAD system or software to map a design to the TM-FPGA and implement the design using the TM-FPGA's resources. FIG. 2 depicts various software modules that TM-FPGA CAD software according to illustrative embodiments of the invention uses. The modules include design-entry module 305; synthesis module 310; partition, place, and route module 315; and verification module 320.

Design-entry module 305 allows the integration of multiple design files. The user may generate the design files by using design-entry module 305 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 310 accepts the output of design-entry module 305. Based on the user-provided design, synthesis module 310 generates appropriate logic circuitry that realizes the user's design. One or more TM-FPGAs (not shown explicitly) implement the synthesized overall design or system. Synthesis module 310 may also generate any glue logic that allows integration and proper operation and interfacing of various modules in the user's designs. For example, synthesis module 310 provides appropriate hardware so that an output of one block properly interfaces with an input of another block. Synthesis module 310 may provide appropriate hardware so as to meet the specifications of each of the modules in the overall design or system.

Furthermore, synthesis module 310 may include algorithms and routines for optimizing the synthesized design. Through optimization, synthesis module 310 seeks to more efficiently use the resources of the one or more TM-FPGAs that implement the overall design or system. Synthesis module 310 provides its output to partition, place, and route module 315.

Partition and schedule module 312 uses the designer's timing specifications and the known context capacity of the TM-FPGA to create sub-circuits, each of which can be mapped onto the hardware. FPGA partitioning is known to persons of ordinary skill in the art. One may port the partitioning software to TM-FPGAs by making modifications to general FPGA partitioning that fall within the knowledge of persons of ordinary skill in the art who have the benefit of the description of the invention. Generally, the modifications relate to stitching one context to other contexts.

For an ordinary FPGA, any partitioning that satisfies the capacity constraints of the hardware constitutes a proper partitioning. TM-FPGAs entail an additional consideration relating to strictly ordering contexts in sequential order (e.g., from 1 to N for an N-context TM-FPGA). This ordering places a constraint on how the software may achieve partitioning because the outputs of any given partition should be either user signals (such as inputs, outputs, and registers), or should be inputs to future or succeeding contexts (with a larger partition order index).

Although portioning constitutes an NP-complete problem, persons of ordinary skill in the art recognize that the software can find appropriate or approximate solutions (compared to an ideal solution). In practice, the added ordering constraint on the outputs may make finding a solution more difficult compared to ordinary FPGA partitioning, thus perhaps involving longer software running times. As persons of ordinary skill in the art recognize, however, one may convert the added constraint to an additional "cost function" for the partitioning software. Thus, one may use many well-known partitioning algorithms for TM-FPGA partitioning by using cost-function modification. The easiest partitioning algorithm that one may adapt to TM-FPGA is perhaps "partitioning by simulated annealing," an algorithm well known to persons skilled in the art. The description below provides an example of a general partitioning and scheduling algorithm according to the invention in connection with FIGS. 4-6.

Place and route module 315 is very similar to the place and route modules of ordinary FPGAs. In fact, in one embodiment according to the invention, where each FPGA logic module uses as many context registers as there are contexts, place and route module 315 virtually needs no modification.

In a different embodiment, where the number of such context registers is fewer on average than the number of contexts of the TM-FPGA, one may make modifications to ordinary FPGA place and route algorithms by using "cost functions." More specifically, similar to the way partition and schedule module 312 introduces additional "cost functions," the placement may introduce such additional cost functions that measure the mismatch of the number of context registers and the user design's requirements at different locations on the TM-FPGA. This additional cost guides the placement algorithm to a successful eventual placement. As noted above, one may use simulated annealing placement to address this added complexity with minimal modifications to ordinary FPGA place and route. Note, however, that one may use other known FPGA place and route algorithms by making relatively minor modifications, as persons of ordinary skill in the art who have the benefit of the description of the invention appreciate.

By proper use of the TM-FPGA routing resources, place and route module 315 helps to meet the critical timing paths of the overall design or system while simultaneously finding a proper fit to the TM-FPGA's resources. Place and route module 315 optimizes the critical timing paths to help provides timing closure faster in a manner known to persons of ordinary skill in the art with the benefit of the description of the invention. As a result, the overall design or system can achieve faster performance (i.e., operate at a higher clock rate or have higher throughput). The description below in connection with implementing a user's design in a TM-FPGA provides more details of the operation of the place route module 315.

Verification module 320 performs simulation and verification of the design. The simulation and verification seek in part to verify that the design complies with the user's prescribed specifications. The simulation and verification also aim at detecting and correcting any design problems before prototyping the design. Thus, verification module 320 helps the user to reduce the overall cost and time-to-market of the overall design or system.

Verification module 320 may support and perform a variety of verification and simulation options, as desired. The options may include design-rule checking, functional verification, test-bench generation, static timing analysis, timing simulation, hardware/software simulation, in-system verification, board-level timing analysis, signal integrity analysis and electro-magnetic compatibility (EMC), formal netlist verification, and power-consumption estimation, as desired. Note that one may perform other or additional verification techniques as desired and as persons of ordinary skill in the art who have the benefit of the description of the invention understand.

The TM-FPGA CAD software may also include a module (not shown in FIG. 2) or routine for producing a bit-stream for programming or configuring the TM-FPGA, as desired. The module provides a bit-stream that, when used to program the TM-FPGA, causes the TM-FPGA to implement the user's desired circuit or system according to the prescribed specifications or functionality.

Figure 3:
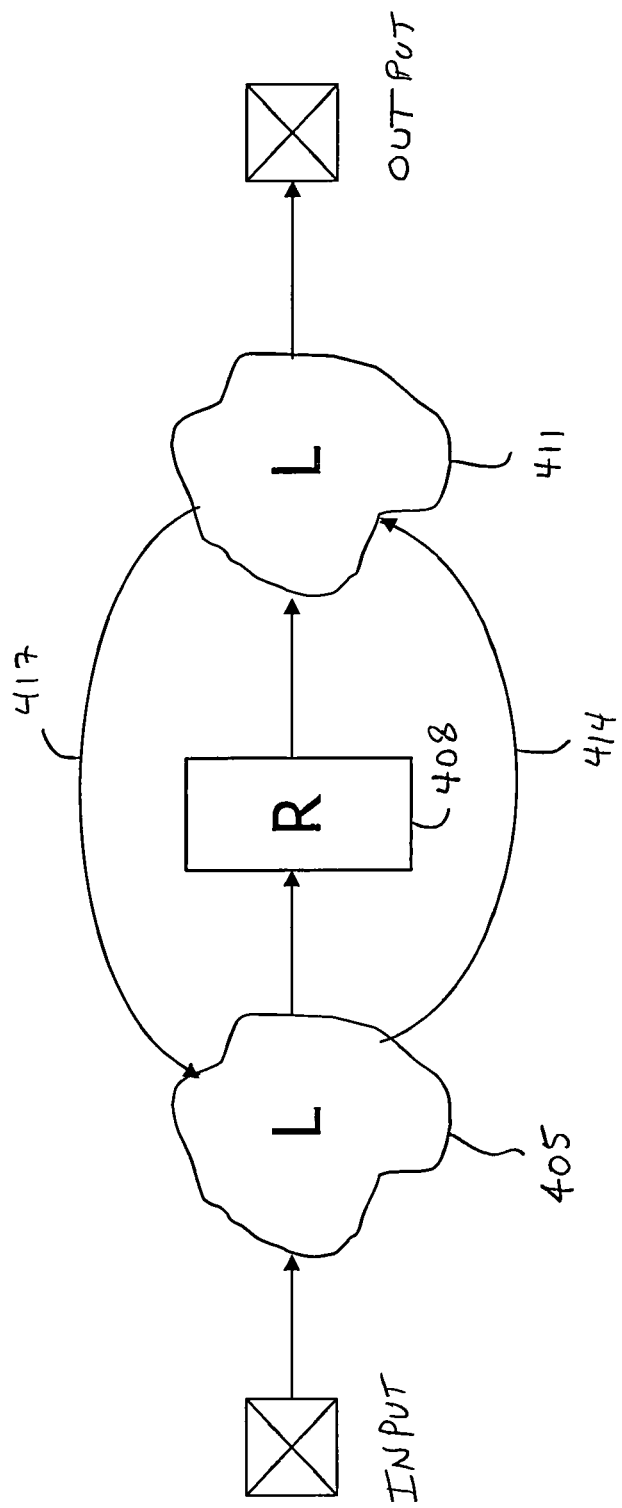
FIG. 3 depicts a general block diagram representation of a user's circuit for implementation in a TM-FPGA according to the invention.

The following description provides further details of how a TM-FPGA implements a user's design. Generally, one may represent a synchronous logic circuit as a combination of sequential and combinational logic. FIG. 3 shows a general block diagram representation of a user's circuit for implementation in a TM-FPGA according to the invention. Generally, the circuit may include combinational logic 405 coupled between the user's input(s) and the FPGA registers 408. Similarly, more combinatorial logic 411 may exist between the user's registers and the user's output(s). Parts (or all) of logic 405 and logic 411 may also couple between two or more registers, as signals 414 and 417 indicate.

Note that, generally speaking, logic circuit 411 may receive, and operate on, one or more signals 414 from logic circuit 405 in addition to the signals received from user registers. Likewise, logic circuit 405 may receive, and operate on, one or more signals 417 from logic circuit 411 (i.e., the circuit may include a feedback signal path).

As noted, the CAD software partitions the user's circuit into several sub-circuits, each of which has a sufficiently small size so as to fit entirely within the TM-FPGA's hardware resources. The TM-FPGA operates on each of the sub-circuits during one of its contexts. By partitioning the user's circuit, the CAD software allows the TM-FPGA to implement a larger circuit than a comparable conventional FPGA can realize. Furthermore, because the CAD software performs the partitioning in a transparent manner, the user need not intervene in the partitioning process. Thus, a typical FPGA user can readily use a TM-FPGA according to the invention to implement his or her circuits.

By exploiting the partitioning process, the TM-FPGA attempts to re-use the same hardware during various contexts, hence the time-multiplexed nature of the FPGA. To do so, the TM-FPGA uses an internal clock signal with a frequency that is a multiple of the frequency of the clock signal of the user's circuit. In other words, if the TM-FPGA has N contexts, $$f_{clk, internal} = N \cdot f_{clk, user},$$

where $f_{clk, internal}$ and $f_{clk, user}$ represent the frequencies of the internal clock and of the user's circuit's clock signals, respectively. Each cycle of the internal clock corresponds to one of the contexts.

On each of the cycles of the internal clock signal, the TP-FPGA operates in one of its contexts (i.e., realizes one part of the partitioned circuit). Each context provides input(s) to one or more future or succeeding contexts, together with any user input, output, and logic signals. In every context (i.e., on every cycle of the internal clock signal), the TM-FPGA generally performs different functions or operations and stores the results of those operations for use in later contexts, as appropriate.

In TM-FPGA, a succeeding context may immediately consume some outputs of a given context, while other outputs hold their state idle for a later context. Note that more than one future or succeeding contexts may use some or all of the outputs. Partition and schedule module 312 (see FIG. 2) seeks to minimize the number of outputs needed in more than one context. As another goal, partition and schedule module 312 also seeks to minimize outputs needed in a context later than the one that immediately follows the current context. Through this minimization, the inventive concepts achieve significant area savings compared to conventional approaches that use as many context registers per programmable logic circuit (e.g., logic element) as the number of contexts of the TM-FPGA.

Figure 4:
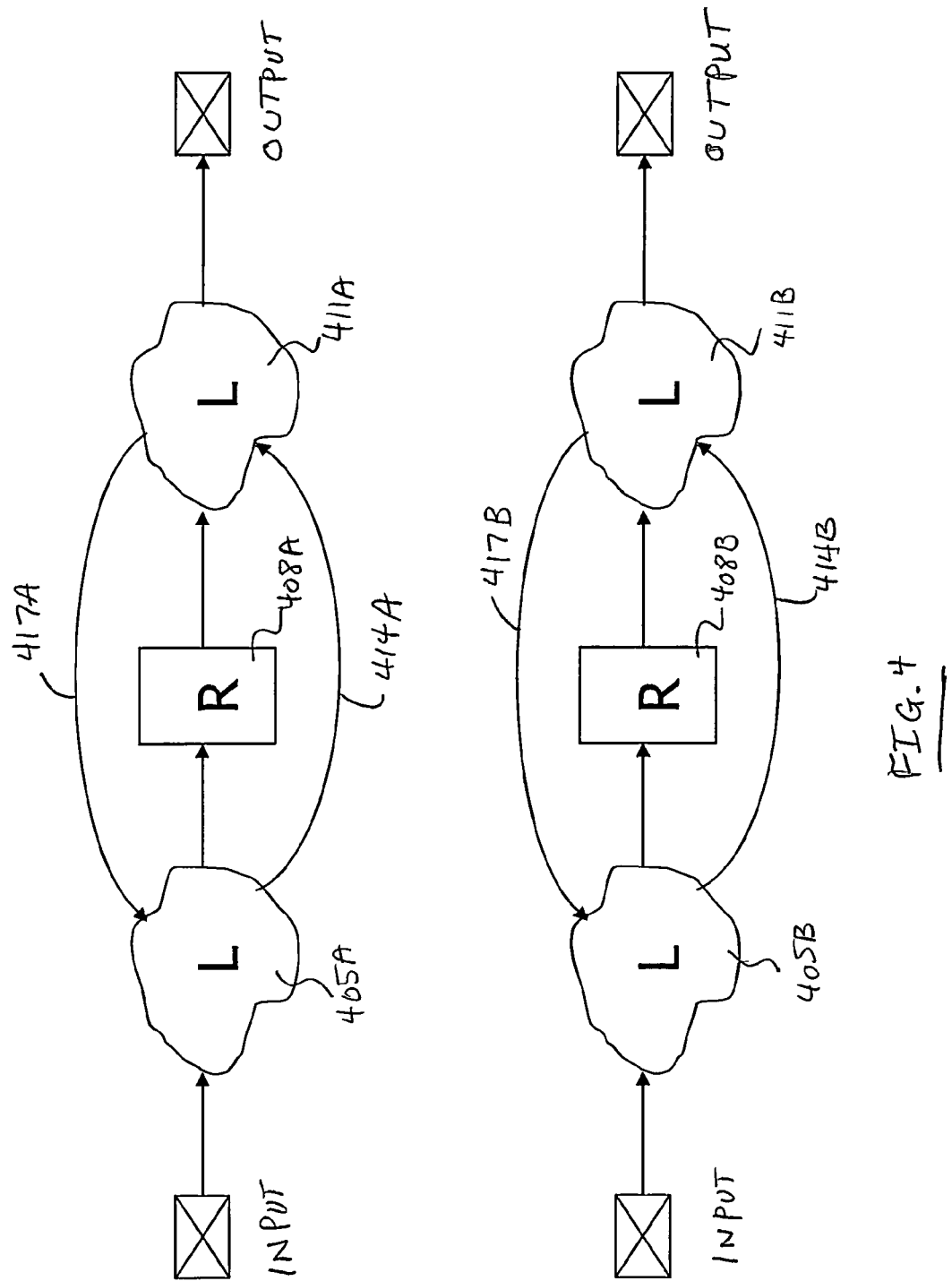
FIG. 4 shows an ideally partitioned circuit, partitioned by CAD software according to the invention.

An ideal partitioning of the user's circuit would result in a circuit that does not include signal inter-dependencies between sub-circuits. FIG. 4 shows an ideally partitioned circuit. Note that such an ideally partitioned circuit is impractical or impossible to realize in relatively large, realistic TM-FPGA designs. In practice, users' circuits almost never lend themselves to the ideal partitioning described above.

Figure 5:
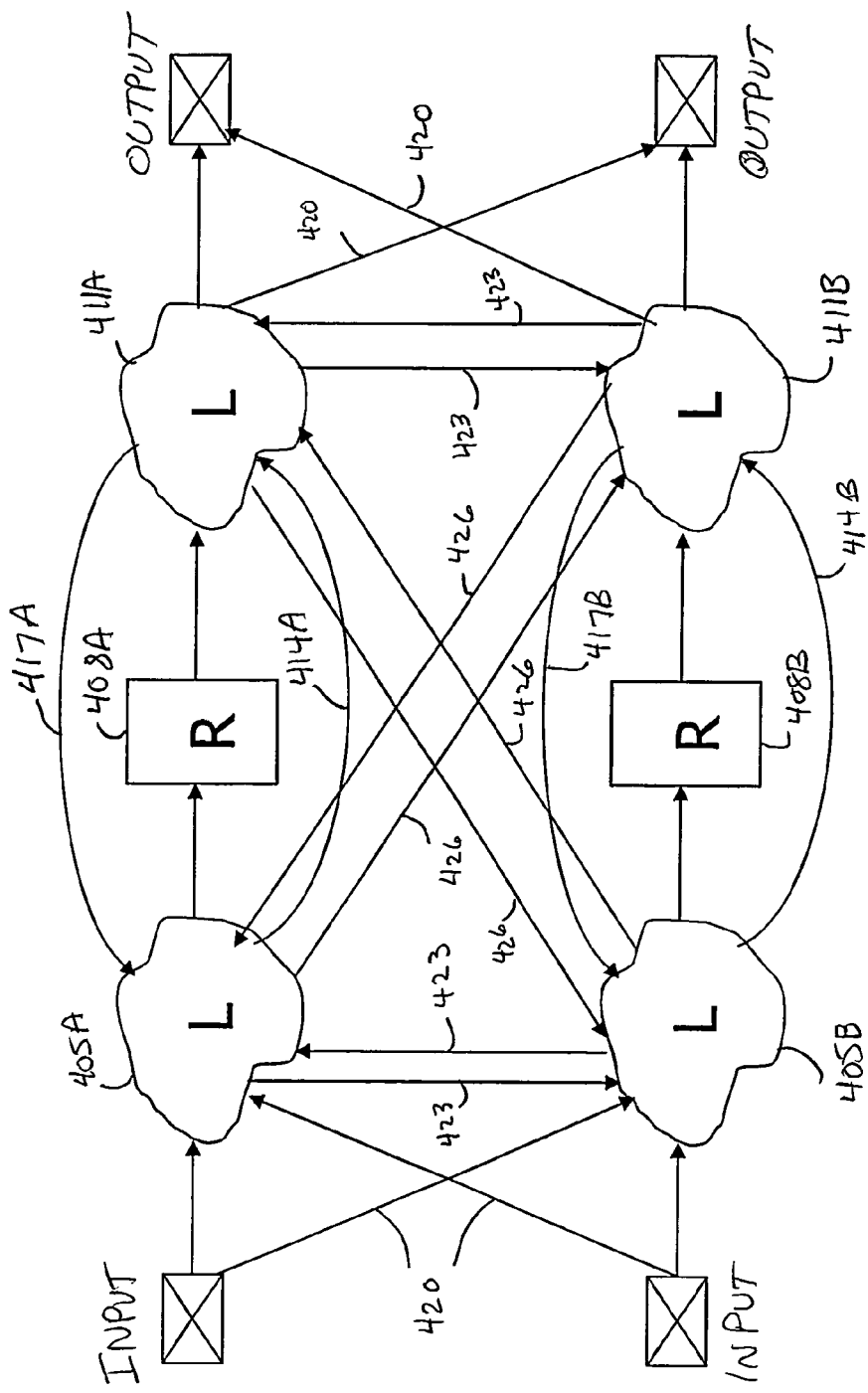
FIG. 5 illustrates a typical partitioning of a user's circuit for implementation in a TM-FPGA according to the invention.

FIG. 5 shows a typical partitioning of a user's circuit for implementation in a TM-FPGA according to the invention. Similar to the partitioning in FIG. 4, the partitioning in FIG. 5 includes signals 414 and 417. In addition, it includes signals 420, 423, and 426. The inclusion of signals 420, 423, and 426 represents the complexity of general users' circuits by taking into account signal flows among the logic circuits (405A, 405B), etc.

Figure 6:
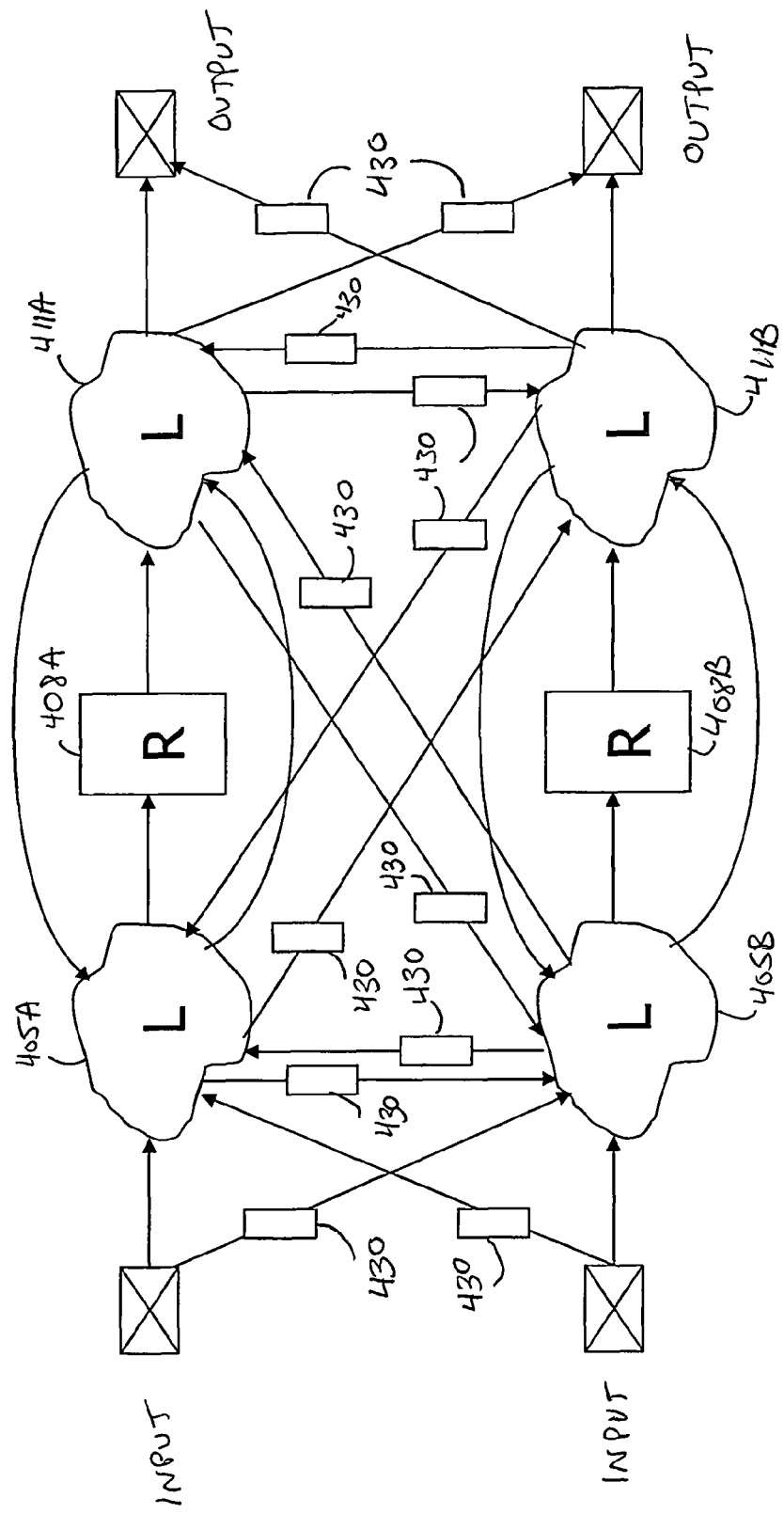
FIG. 6 depicts an example of a user's circuit with context registers or storage elements added to facilitate partitioning of the circuit by the CAD software.

As noted above, any given context of the TM-FPGA may provide signals to one or more subsequent contexts. To do so, TM-FPGAs according to the invention use context registers or storage elements. FIG. 6 shows an illustrative user's circuit with context registers or storage elements 430 added to facilitate partitioning of the circuit by the CAD software. Put another way, each context may communicate signals and information to another context through the use of context registers 430 (together with the user's input, logic (including registers as part of the user-programmable logic resources of the TM-FPGA), and output signals). Note that the internal clock (with frequency $f_{clk, internal}$, described above) serves as the clock source for context registers 430).

As described below in more detail, during the process of mapping the user's circuit to the TM-FPGA's resources, the CAD software attempts to reduce the number of the context registers by merging them with other registers. By doing so, the CAD software reduces the overhead associated with the time-multiplexed nature of the FPGA and, thus, increases overall efficiency of the circuit implementation.

As described above, the context registers facilitate information interchange (temporary results) among the N contexts. Typically, for a given context, say, context j, at least one other context, for example, context (j+1), uses the temporary results of context j. In general, context (j+k) may use the temporary results of context j, where 0<k≤N. Note that the case (j+k)>N is permissible, in which case the context with index (j+k) mod N in the next user clock cycle will use the output. Note further that more than one context may use the temporary results from a given context, such as context j. The context registers allow one context to use the temporary results from another context.

As noted above, one may use the following algorithm to implement a relatively compact partitioning and scheduling of a TM-FPGA. The algorithm partitions the entire user's design into N sub-circuits, where N represents the number of the contexts of the TM-FPGA, and L represents the number of context registers. The partitioning occurs such that:

(1) Each sub-circuit [j] contains fewer resources (such as LUTs, registers, etc.) than available in one context;
(2) Each sub-circuit [j] has O[j] outputs to other partitions, where O[j]≥0;
(3) Each sub-circuit [j] has C[j] inputs from previous contexts that it consumes entirely, where C[j]≥0 (in other words, a future context no longer needs the inputs from previous contexts);
(4) No partition [j] may have outputs feeding a partition [i] where i<j (note, however, that outputs may feed a partition [N+i], where i<j); and
(5) The numbers O[j] and I[j] defined in steps (2) and (3) satisfy the inequality:

$$L \geq \left( \sum_j O[j] - \sum_j C[j] \right).$$

The partitioning and scheduling algorithm achieves its goal by simultaneously minimizing the first sum in step (5) above as well as by maximizing the second sum in step (5).

Note that the circuits in FIGS. 4-6 help to illustrate the inventive partitioning concepts with respect to an exemplary two-context circuit. As persons of ordinary skill in the art who have the benefit of the description of the invention understand, one may apply the disclosed concepts to other circuits, as desired. Such circuits may generally have more than two contexts.

Figure 7:
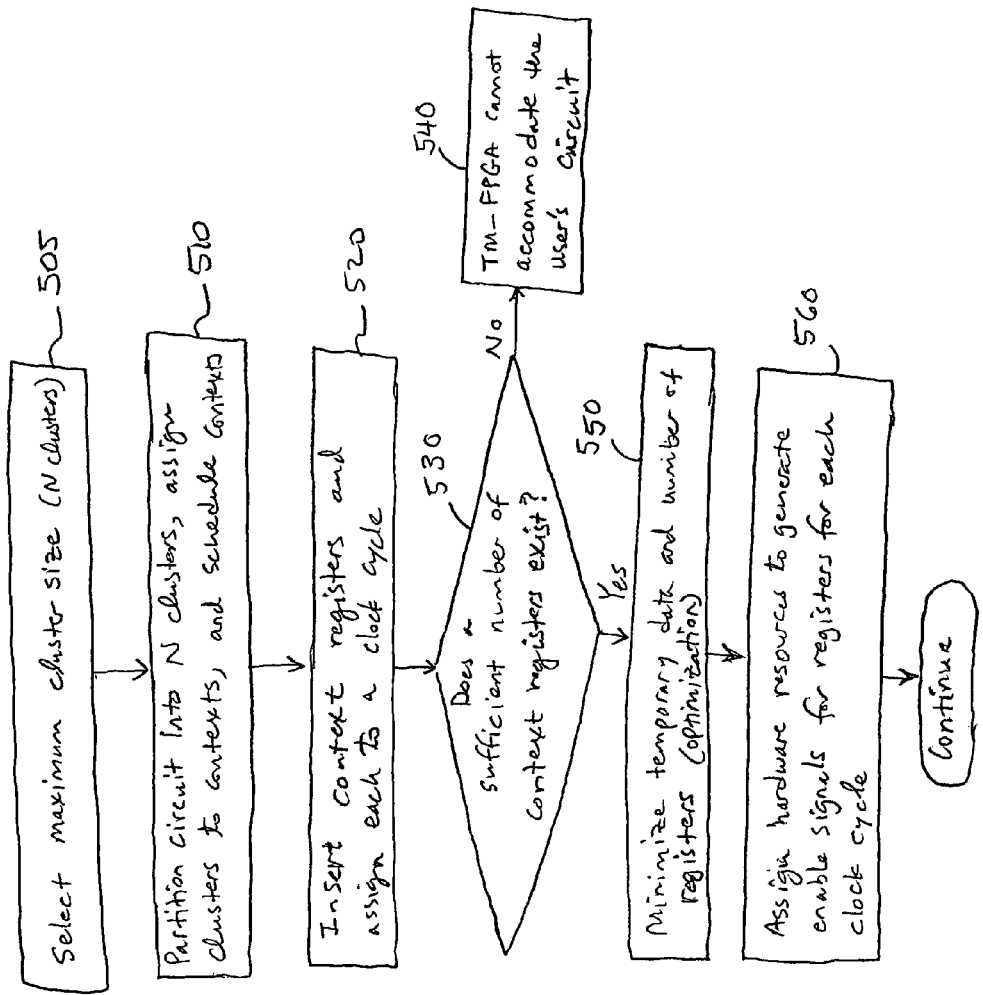
FIG. 7 shows a simplified flow diagram of a process that CAD software according to exemplary embodiments of the invention performs to map a user's circuit to a TM-FPGA's resources.

FIG. 7-FIG. 7 shows a simplified flow diagram of a process that CAD software according to exemplary embodiments of the invention performs to map a user's circuit to a TM-FPGA's resources. Starting with a user's circuit (obtained by the CAD software, as described above), at 503 the software selects a maximum cluster size for each of the clusters. Each of the clusters corresponds to one of the N contexts (i.e., a total of N clusters for an N-context TM-FPGA).

At 510, the software partitions the circuit into N clusters, and assigns the clusters to a corresponding context. The software furthermore schedules the contexts. Put another way, it determines the order in which the context follow one another (in time). At 520, the software inserts context registers (described above) into the circuit. The software also assigns each of the context registers to one or more clock cycles, with the clock cycles ranging from zero to (N−1).

At 530, the software checks to determine whether the TM-FPGA includes a sufficient number of context registers to accommodate the user's circuit. The size and amount of hardware resources within the TM-FPGA determines the number of context registers and, hence, the size of the user's circuit that the TM-FPGA can implement.

If the TM-FPGA does not include a sufficient number of context registers, the software concludes at 540 that the TM-FPGA cannot accommodate the user's circuit. Otherwise, at 550, the software performs optimization tasks. More specifically, the software attempts to minimize temporary information and data used in subsequent contexts, and the number of context registers (by merging their functionality with other registers or by re-using them in various contexts).

Note that FIG. 7 shows merely one possible process for mapping a user's circuit to a TM-FPGA's resources. One may make a variety of modifications to the embodiment in FIG. 7, as desired, and as persons of ordinary skill in the art who have the benefit of the disclosed concepts understand. For example, one may perform optimization before checking to determine whether a sufficient number of context registers exist (i.e., reverse the order of 530 and 550). Put another way, one may first perform optimization to reduce the number of context registers before checking to see whether the TM-FPGA's resources include a sufficient number of context registers.

The nature of the information or data stored in the context registers affects the amount of resources that the TM-FPGA uses to implement the user's circuit. Temporary stored data used in the immediately succeeding context use relatively little resources. In that scenario, the software can re-use the context register(s) used to store such data in one or more other contexts.

Temporary stored data used in two or more contexts in the future use more TM-FPGA resources. Here, the data persist for more than one clock cycle. As a result, the software cannot re-use the context register(s) in other contexts.

In some circumstances, a combinational logic circuit in the TM-FPGA may feed an output pin of a user's circuit. An external circuit (i.e., the circuit coupled to the output pin) may expect the logic value at the output pin held constant for an entire cycle of the user's clock signal. In such a case, the software uses a context register to store the logic signal for the output pin and to hold its value for one or more cycles of the user's clock signal. Note that, in the case of signals passing through the TM-FPGA without routing through any sequential logic circuit (e.g., from an input to a combinational logic circuit to an output), the software does not use any time-multiplexing for the programmable logic resources involved in the signal's path (e.g., LUTs).

At 560, the software uses appropriate hardware resources to create N enable signals for routing to appropriate registers for each clock cycle. Note that, for each clock cycle, the software does not enable a context register not needed in the next clock cycle (but needed in subsequent clock cycles).

Subsequently, the software (more specifically, the placement algorithm) assigns the context registers to hardware resources within the TM-FPGA. To do so, the software takes into account not only the location of the resources, but also the clock cycle assignments of the context registers.

Figure 8:
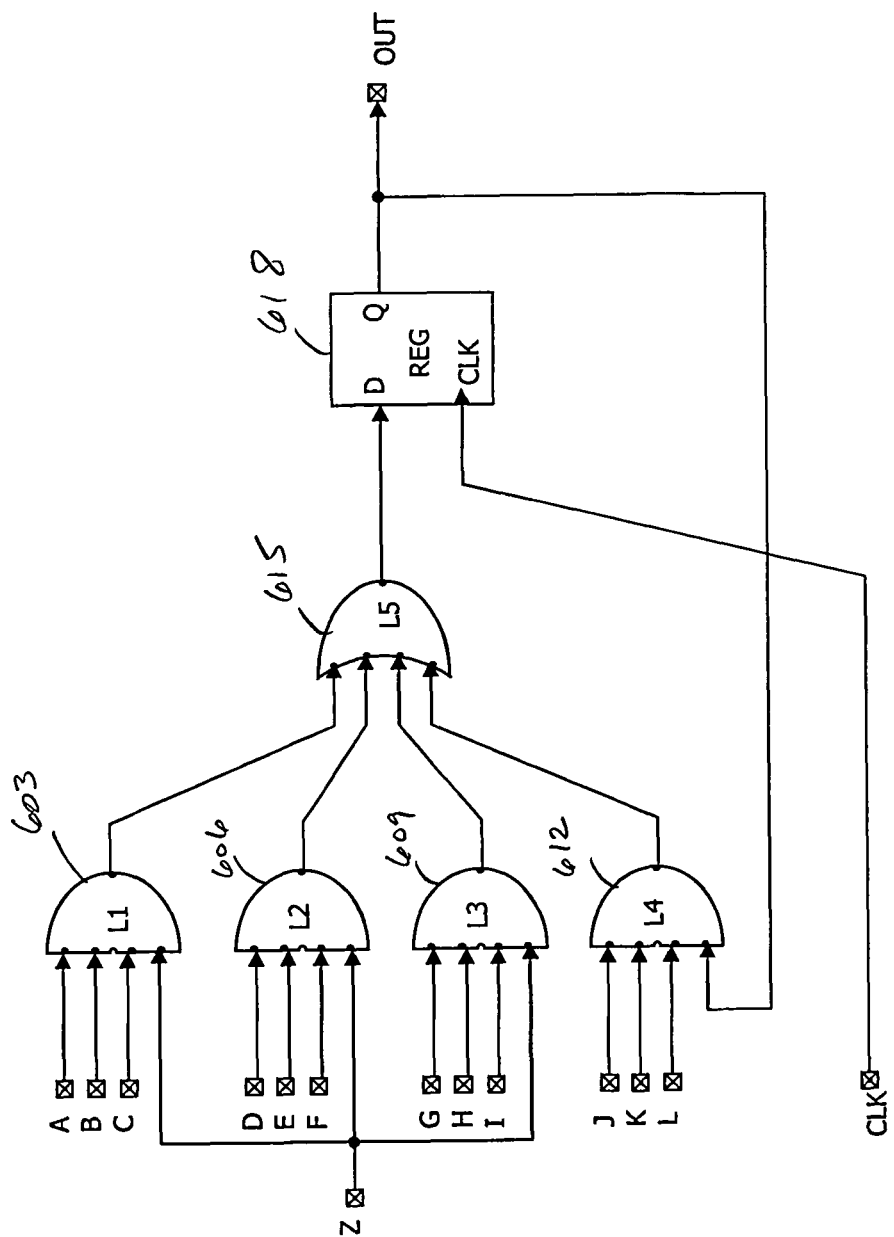
FIG. 8 illustrates an example of a simple circuit for implementation in a TM-FPGA.

FIGS. 8-15 show an example of how one may implement a simple circuit using an TM-FPGA according to the invention. FIG. 8 depicts an example of a simple circuit for implementation in a TM-FPGA. The circuit includes AND gates 603, 606, 609, and 612 (labeled "L1" through "L4," respectively); OR gate 615 (labeled "L5"); and register 618. The circuit accepts input signals labeled A-L and Z. A clock signal (labeled "CLK") clocks register 618. Note that the circuit includes a feedback signal path from the Q output of register 618 to an input of AND gate 612.

Figure 9:
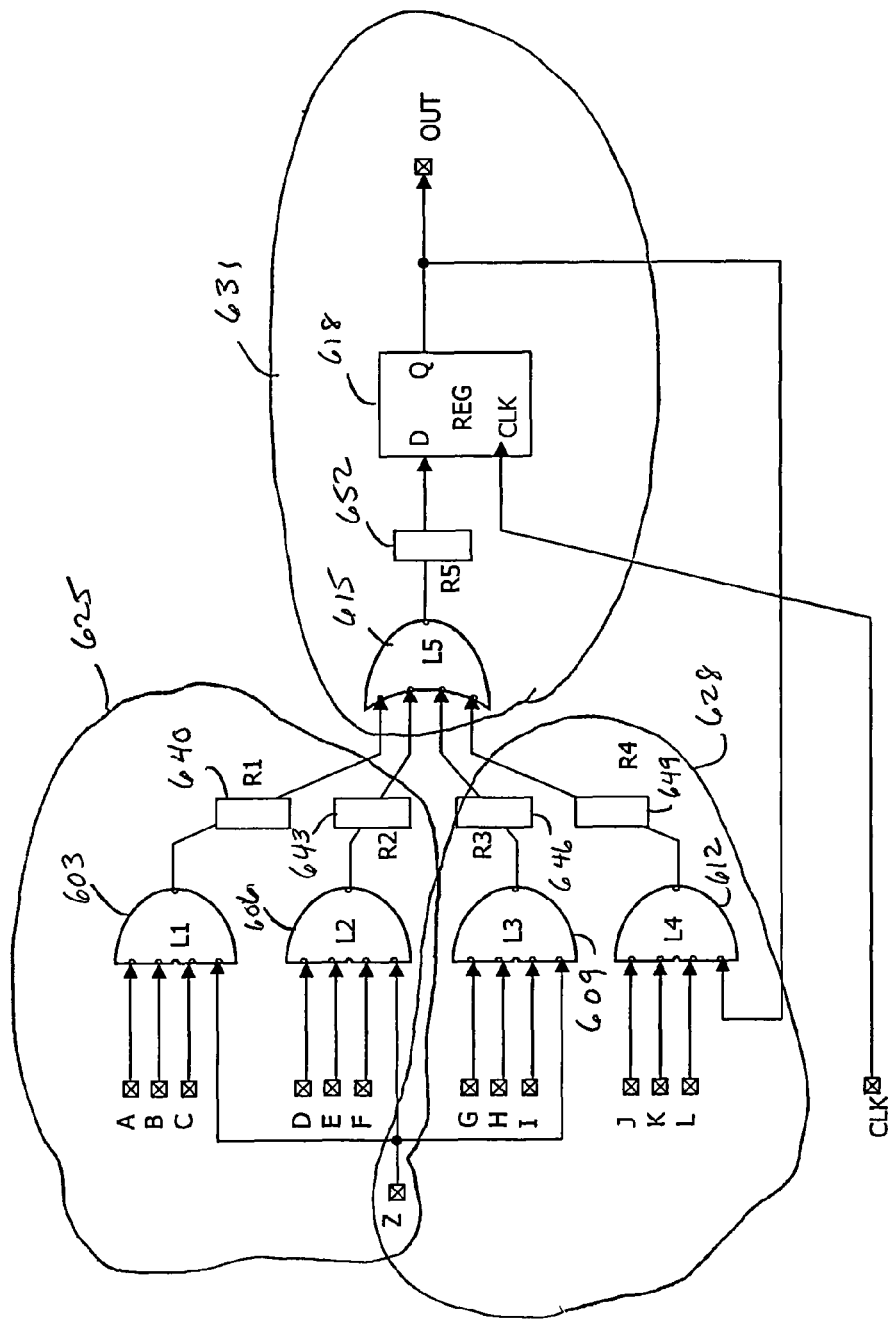
FIG. 9 depicts the circuit of FIG. 8 partitioned by the CAD software into clusters.

FIG. 9 shows the circuit of FIG. 8 partitioned by the CAD software into three clusters, cluster 625, cluster 628, and cluster 631. Each of clusters 625, 628, and 631 represents a context (i.e., a three-context TM-FPGA implementation).

The software also assigns the clusters to respective cycles of the internal clock signal. For example, the software may assign the first cluster (cluster 625) to the first cycle of the TM-FPGA internal clock, and so on. The software also schedules the order of the three contexts. As an example, context one becomes active during the first clock cycle, and contexts two and three become active during the two subsequent respective clock cycles.

Note that the CAD software has automatically inserted context registers 640, 643, 646, 649, and 652 (labeled as "R1" through "R5"). The software assigns context registers 640 and 643 to the first clock cycle (context one), context registers 646 and 649 to the second clock cycle (context two), and context register 652 to the third clock cycle (context three).

Figure 10:
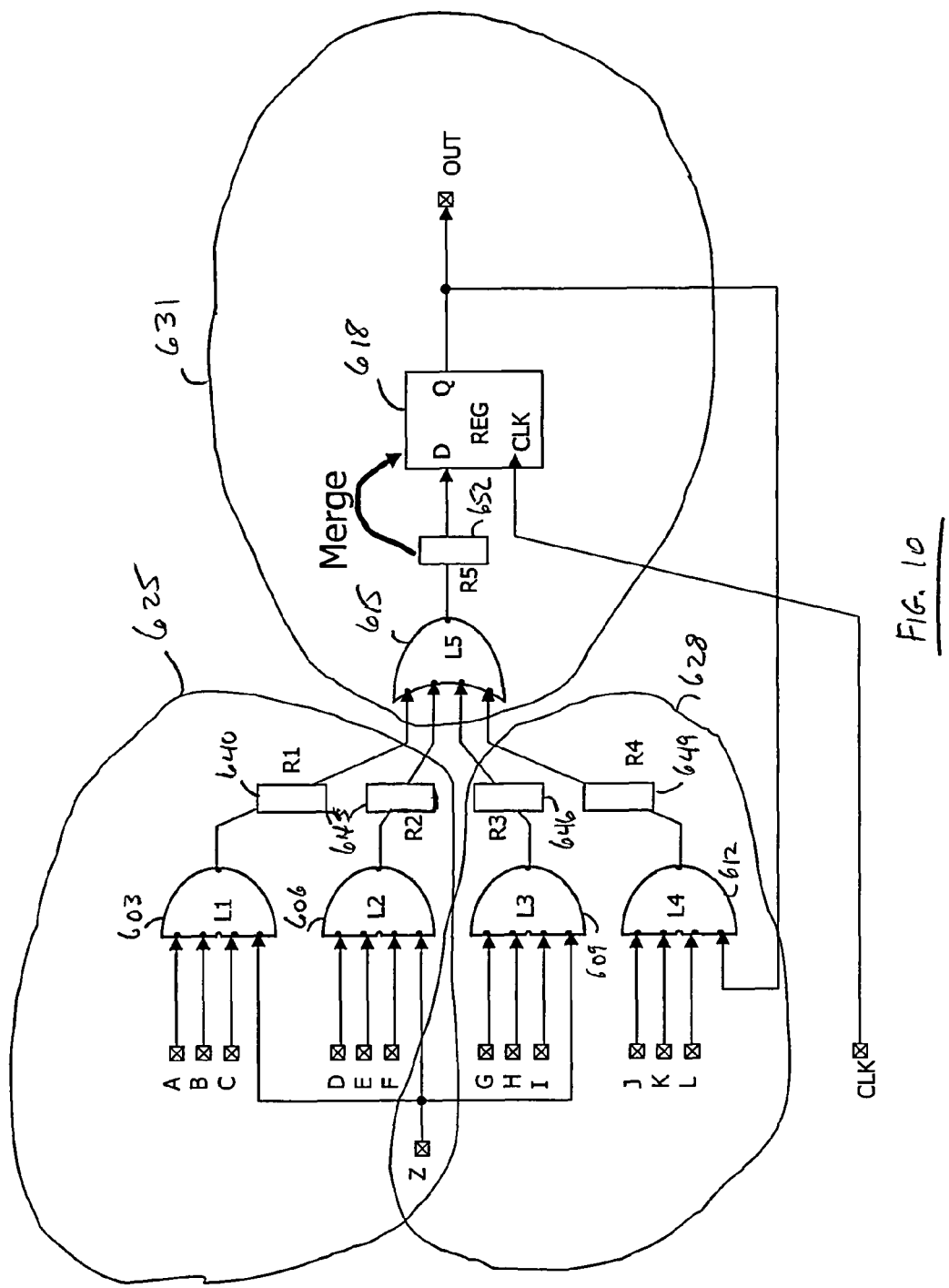
FIG. 10 shows the circuit of FIG. 9, as further processed by the CAD software.

FIG. 10 illustrates the circuit of FIG. 9, as further processed by the CAD software. More specifically, here, the software merges context register 652 with register 618. Put another way, the software determines that register 652 is redundant because register 618 already ensures that the output of context three is available to context one. Thus, the software merges the functionality of context register 652 with the functionality of register 618 by removing context register 652.

Figure 11:
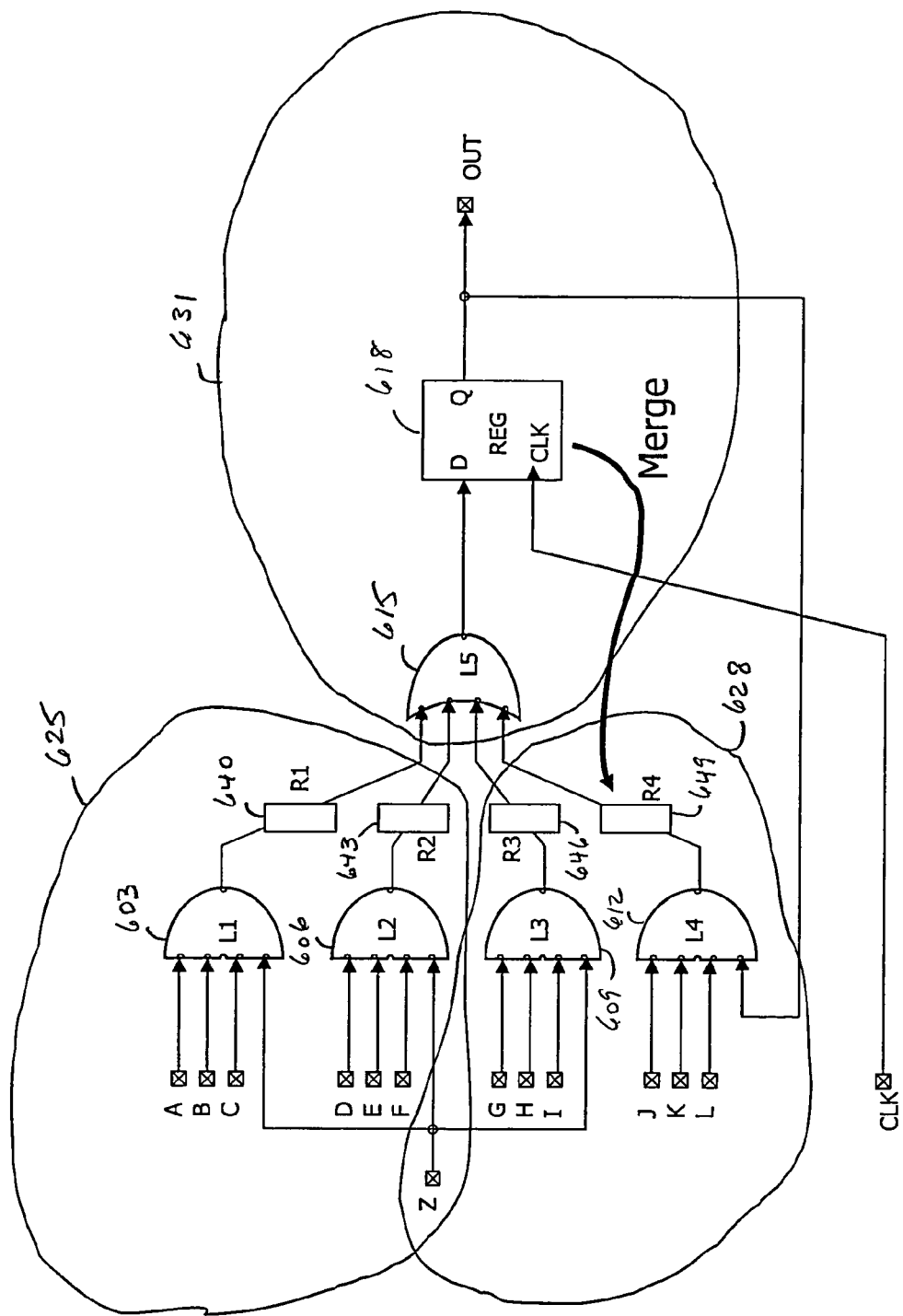
FIG. 11 illustrates the circuit of FIG. 10, as further processed by the CAD software.

FIG. 11 illustrates the circuit of FIG. 10, as further processed by the CAD software. Here, similar to FIG. 10, the software optimizes the circuit further by re-using context register 649 in more than one context. More specifically, in one context, context register 649 can implement its own functionality, and in another context, it can realize the functionality of register 618. The re-using of context register 649 makes register 618 redundant. Consequently, the software removes register 618 and merges its functionality with the functionality of context register 649.

Figure 12:
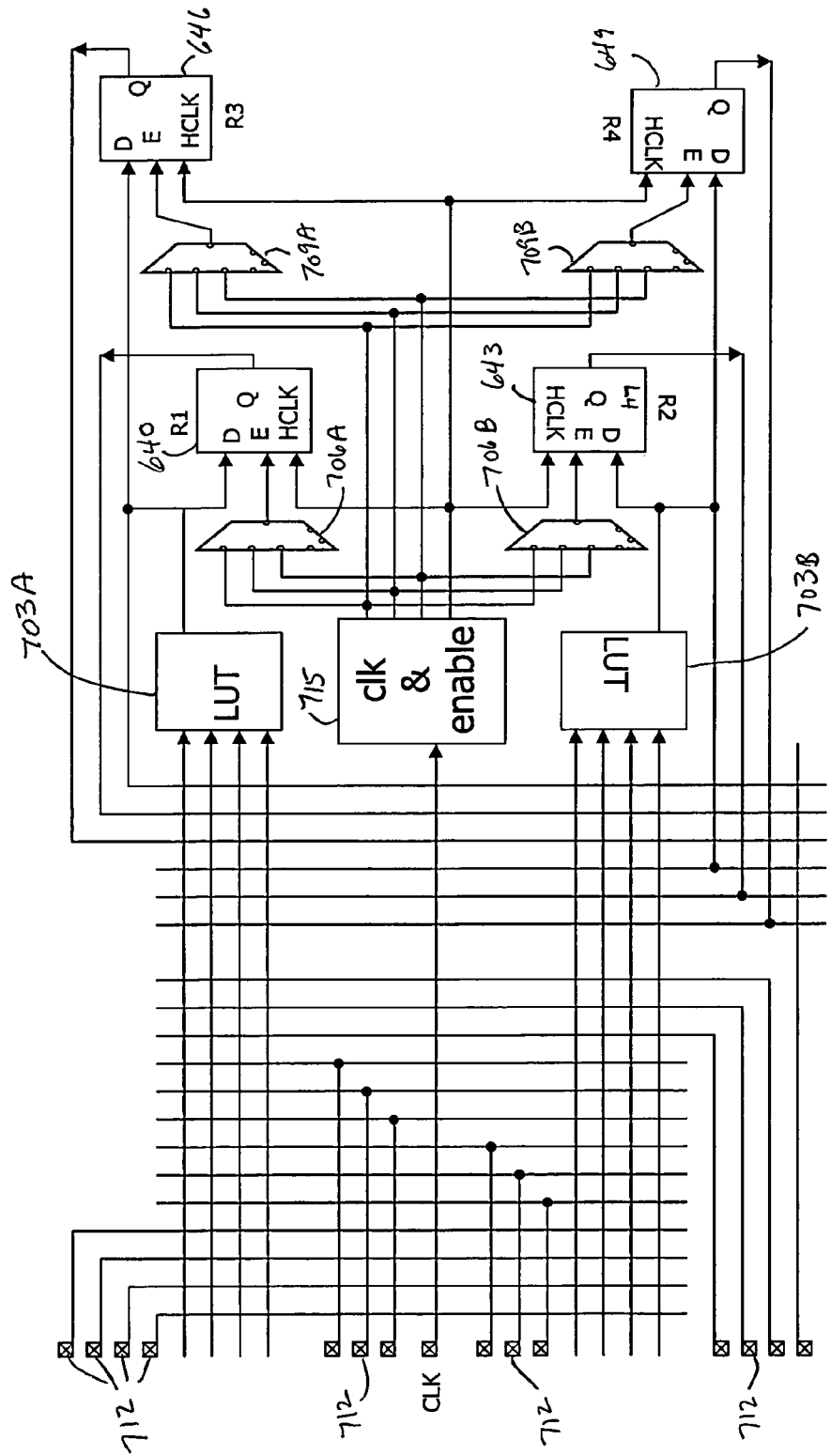
FIG. 12 depicts an illustrative embodiment of a three-context TM-FPGA used to implement the simple circuit shown in FIG. 11.

FIG. 12 shows an illustrative embodiment of a three-context TM-FPGA used to implement the simple circuit shown in FIG. 11. The TM-FPGA includes input/output terminals (or pads) 712; four-input LUTs 703A and 703B; multiplexers (MUXs) 706A, 706B, 709A, and 709B; clock and enable circuit 715; and registers 640, 643, 646, and 649. Each of LUTs 703A-703B may implement the functionality of one of the logic gates (see FIG. 11). Registers 640, 643, 646, and 649 realize, respectively, the functionality of registers R1-R4 (see FIG. 11).

Clock and enable circuit 715 accepts the input clock signal (labeled "CLK"), and generates clock and enable signals for registers 640, 643, 646, and 649. In other words, MUXs 706A, 706B, 709A, and 709B facilitate the routing of the clock and enable signals to registers 640, 643, 646, and 649. Bits in the configuration memory drive the select inputs of MUXs 706A, 706B, 709A, and 709B (configuration memory and connections not shown explicitly for the sake of clarity) so as to enable registers 640, 643, 646, and 649, as appropriate during each context.

Figure 13:
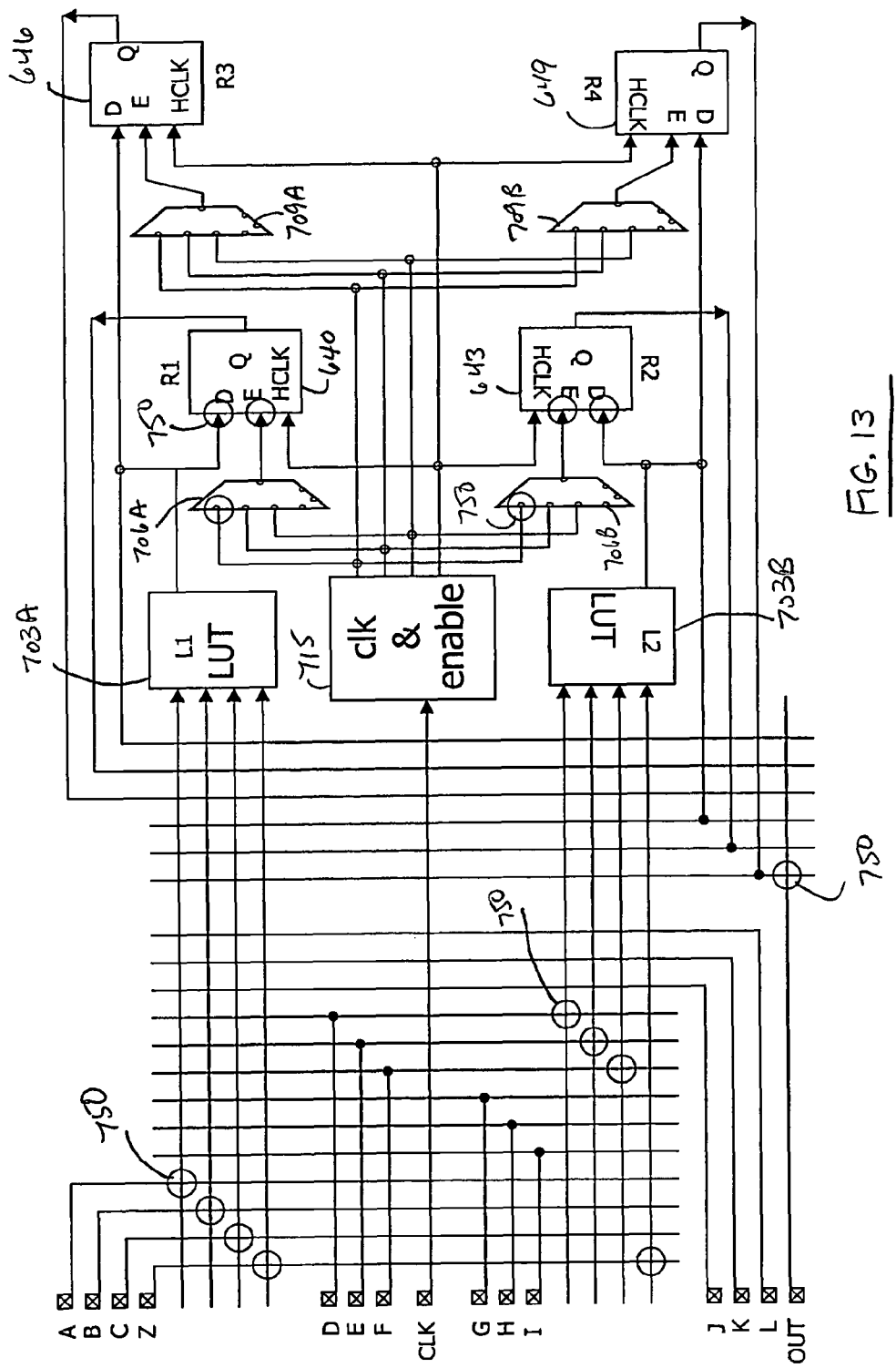
FIG. 13 shows the functionality realized by the various resources within the TM-FPGA during the first context of the TM-FPGA in FIG. 12.

FIG. 13 illustrates the functionality realized by the various resources within the TM-FPGA during the first context. Notations inside each of LUTs 703A and 703B denote the functionality of which the LUT implements. For example, LUT 703A implements the functionality of gate L1 (see FIG. 11).

Figure 14:
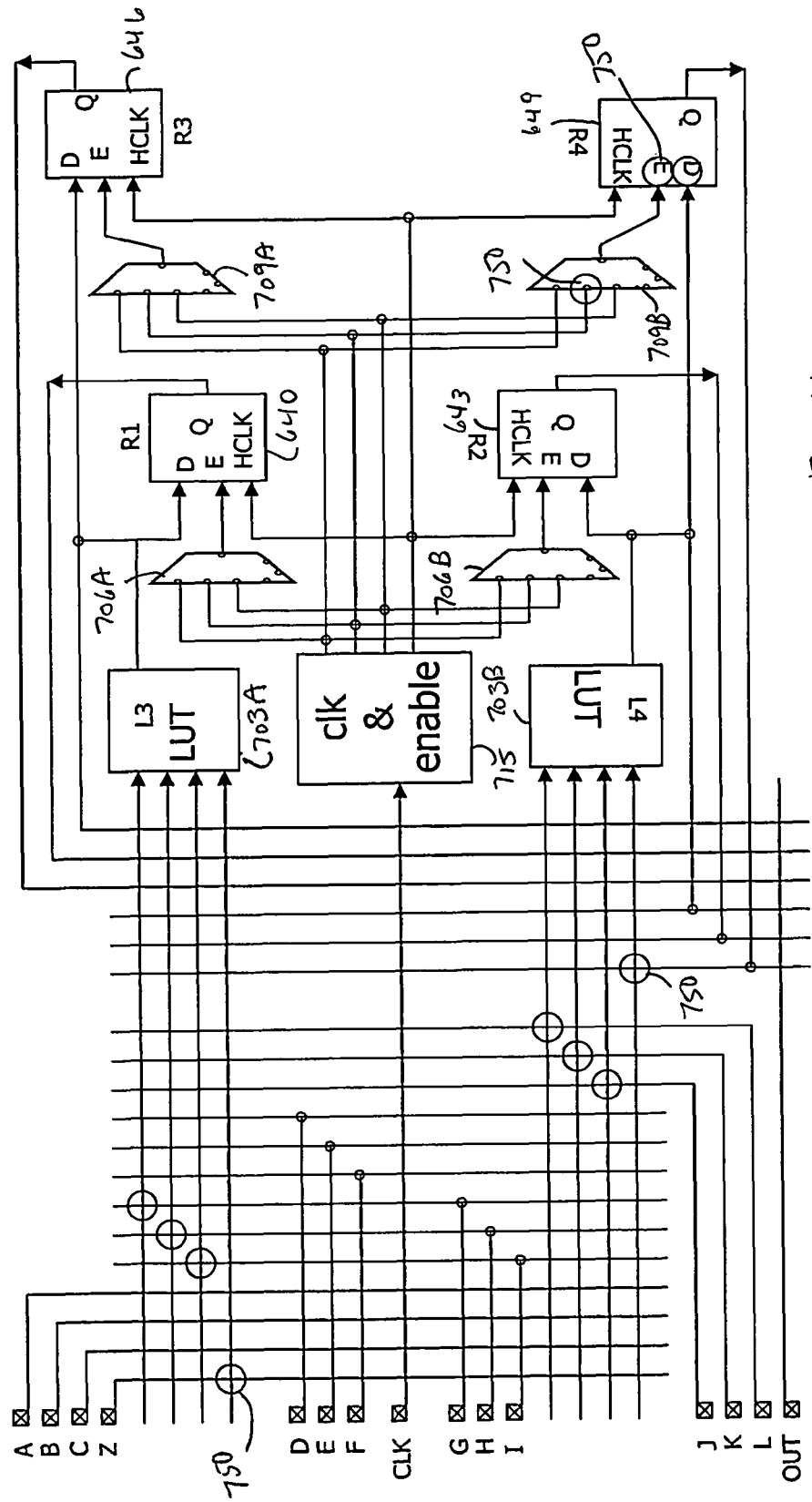
FIG. 14 illustrates shows the functionality realized by the various resources within the TM-FPGA during the second context of the TM-FPGA in FIG. 12.
Figure 15:
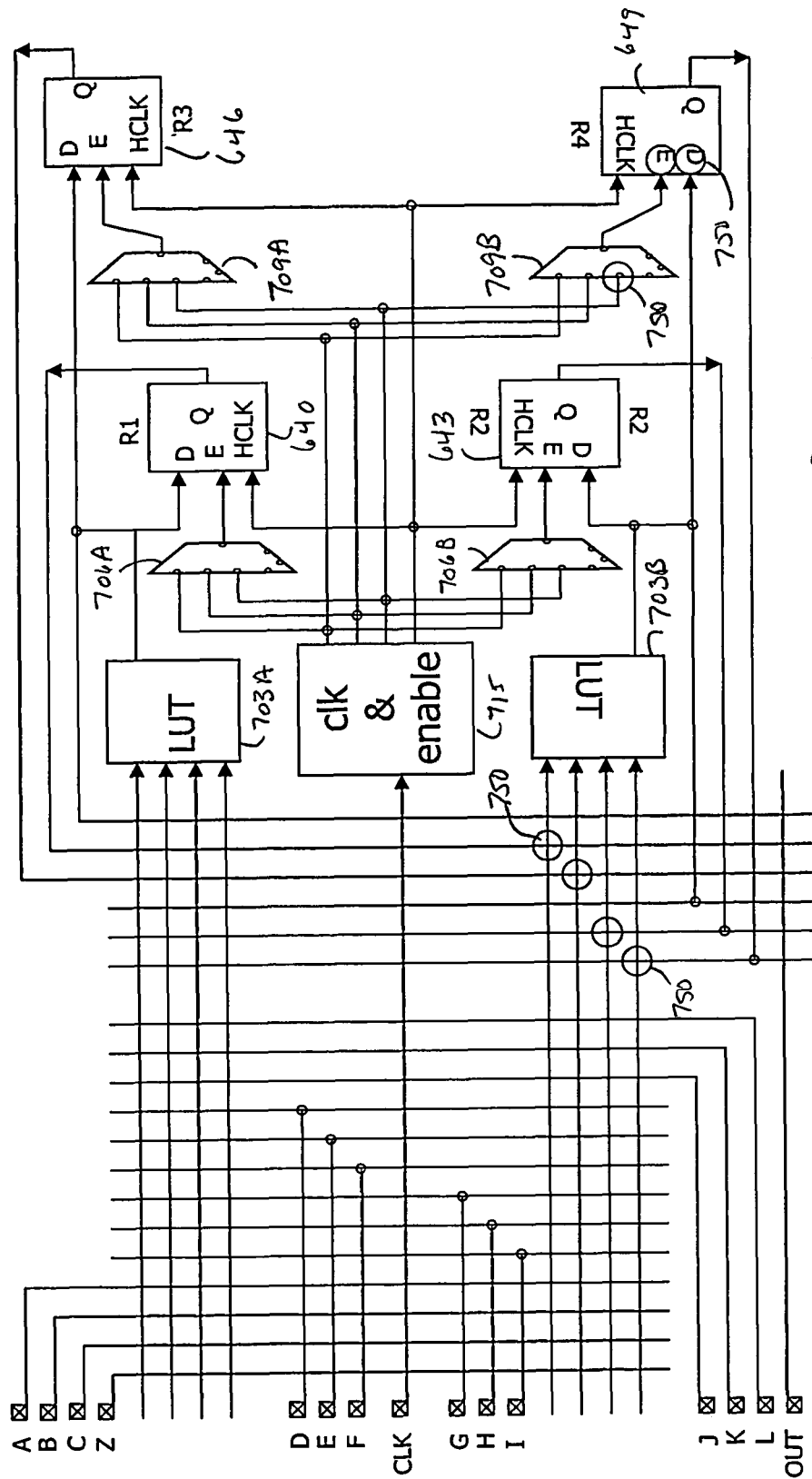
FIG. 15 depicts shows the functionality realized by the various resources within the TM-FPGA during the third context of the TM-FPGA in FIG. 12.

Circles 750 denote an active routing coupling or an active signal. As an example, input A couples to an input of LUT 703A. As another example, MUX 706A and MUX 706B enable, respectively, registers 640 and 643. Similar to FIG. 13, FIG. 14 and FIG. 15 illustrate, respectively, the functionality realized by the various resources within the TM-FPGA during the second and third contexts.

The architecture and structure of TM-FPGAs according to the invention differ in several aspects from conventional TM-FPGAs and FPGAs. The disclosed TM-FPGAs use more configuration memory bits to program a given configurable or programmable element or resource (for example, a programmable logic element or programmable interconnect) than do conventional FPGAs. A conventional FPGA may use a single configuration memory bit to configure or program a resource, say, a programmable interconnect. During the configuration process, configuration circuitry 130 (see FIG. 1) stores an appropriate value in that memory bit in order to configure the programmable interconnect.

In contrast, TM-FPGAs according to the invention use one memory bit or location for each context in order to configure a given resource, for example, the programmable interconnect mentioned above. Each of the memory bits configures the programmable interconnect for a respective context. Thus, for N contexts, the TM-FPGA uses N memory bits per configurable or programmable resource. Note that, for each context, the TM-FPGA may use the configurable or programmable resources differently than other contexts.

In embodiments according to the invention, rather than a single bit of configuration memory, an N-context TM-FPGA uses a circular N-bit first-in, first-out (FIFO) circuit. The configuration data values stored successively in the circular FIFO configure or program the functionality of a given resource within the TM-FPGA.

Figure 16:
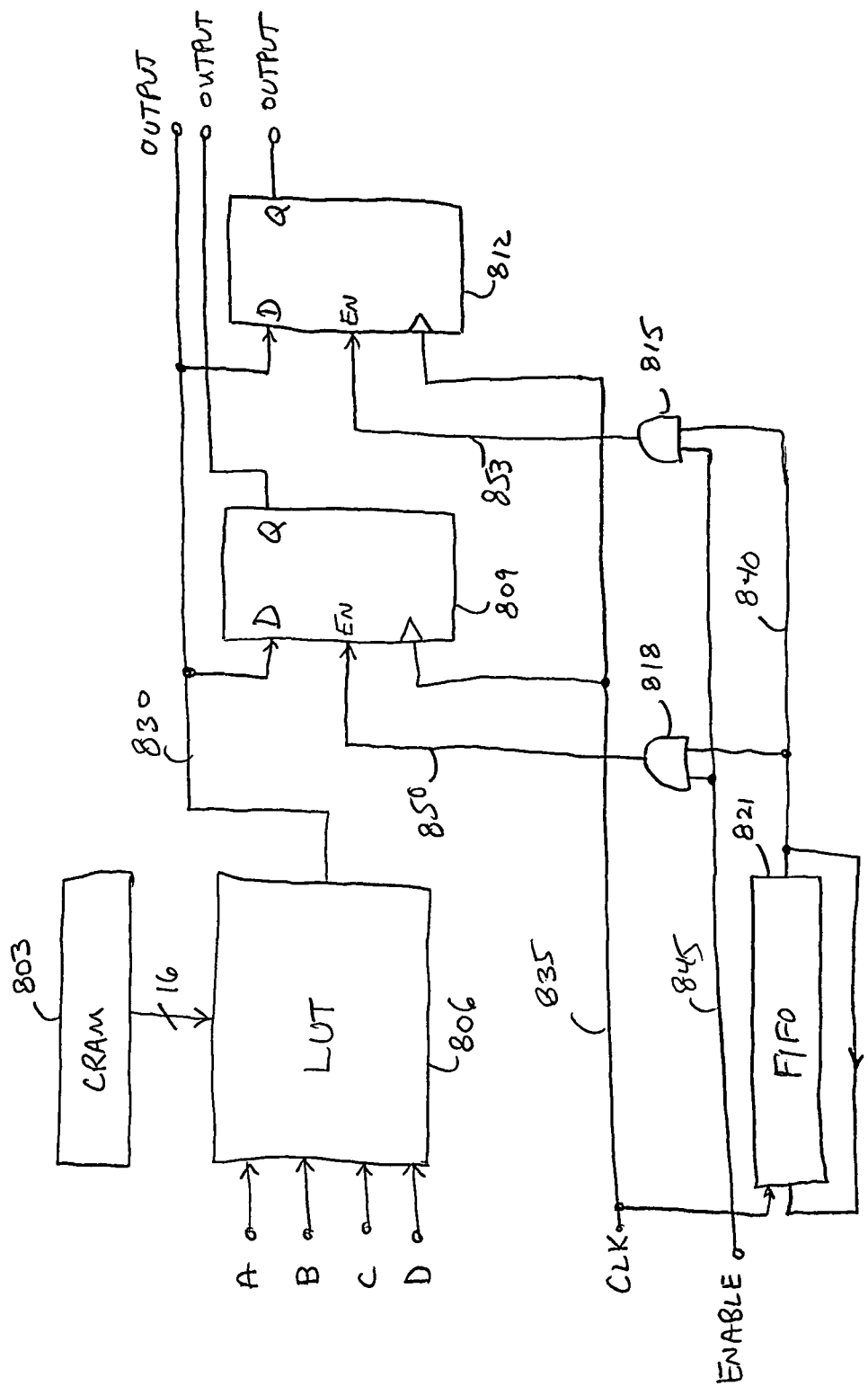
FIG. 16 shows a block diagram of a configurable or programmable logic circuit used in TM-FPGAs according to exemplary embodiments of the invention.

FIG. 16 shows a block diagram of a configurable or programmable logic circuit (known by various names to persons of ordinary skill in the art, such as LE) used in TM-FPGAs according to exemplary embodiments of the invention. The programmable logic circuit includes four-input LUT 806; CRAM 803; registers 809 and 812; AND gates 815 and 818; and FIFO 821.

Note that FIG. 16 shows a two-context programmable logic circuit, with two registers. One may employ programmable logic circuits suitable for use with other numbers of contexts (generally, N contexts), registers, etc., as desired. Moreover, persons of ordinary skill in the art who have the benefit of the description of the invention understand that FIG. 16 does not explicitly show all components or circuitry within the programmable logic circuit (for example, it omits any input and output MUXs, arithmetic and carry circuits, etc.).

Depending the values of 16 data bits from CRAM 803, LUT 806 can realize an arbitrary logic function of the four inputs, A, B, C, and D. Registers 809 and 812 receive at their D inputs the output signal 830 of LUT 806. The output signals of LUT 806 and registers 809 and 812 constitute the output signals of the programmable logic circuit. Clock signal 835 clocks FIFO 821 and registers 809 and 812.

FIFO 821 helps to generate enable signals for registers 809 and 812. More specifically, in response to clock signal 835, FIFO 821 generates an output signal 840 that it supplies to AND gates 815 and 815. Using signal 840, AND gates 815 and 818 gate ENABLE signal 845 to generate enable signals 850 and 853. Enable signals 850 and 853 drive, respectively, the enable (EN) inputs of registers 809 and 812. By causing appropriate CRAM data values to load into FIFO 821, one may enable register 809 and register 812 in the proper context.

Using FIFO 821 provides an advantage where one desires to include error-correction circuitry. More specifically, adding error-correction circuitry in other memory circuits used (e.g., SRAM circuitry) tends to be expensive, for example, in terms of circuit complexity, die area, etc. In contrast, adding error-correction capability to FIFO 821 is relatively low-cost. Thus, one may add error-correction circuitry to TM-FPGAs that use FIFOs as described here, with relatively low circuit complexity and a relatively small increase in die area, as desired:

In the example shown in FIG. 16, FIFO 821 constitutes a 2×2-bit circular FIFO circuit. Persons of ordinary skill in the art with the benefit of the description of the invention recognize, however, that the size and configuration of FIFO 821 depends on design and performance specifications for a given application.

FIFO 821 generally has a k×N-bit configuration, where k and N represent the number of registers and the number of contexts, respectively. In the example shown, k=N but, generally, k≤N. As noted, the inventive concepts provide the capability to automatically partition and schedule the user's design, without any input or intervention from the user, into an N-context TM-FPGA, where number of context registers per programmable logic circuit (e.g., logic element) is k on average (but may be more or less than k), and where k<N.

The number of registers per programmable logic circuit need not equal the number of contexts. For example, two registers per programmable logic circuit on average suffice for a four-context TM-FPGA. The average number of registers k per programmable logic circuit may be significantly less than the number of contexts. As an example, three registers may suffice for an eight-context TM-FPGA.

Note that circular FIFOs constitute only one way of configuring resources within the TM-FPGA. As persons of ordinary skill in the art who have the benefit of the description of the invention understand, depending on the application and design and performance specifications and goals, one may user other appropriate circuits, such as a random-access memory (RAM), as desired.

Conventional programmable logic circuits use a single register that multiple contexts can use (for example, a single register, together with N memory bits, for an N-context implementation). In contrast, programmable logic circuits according to the invention (for instance, the two-context version in FIG. 16) use multiple registers. The programmable logic circuits therefore need not include the memory circuits associated with the conventional single-register approach and may instead use the FIFO structure (or other desired structure). Note that different programmable logic circuits in TM-FPGAs according to the invention need not include the same number of registers.

Furthermore, the number of registers per programmable logic circuit need not equal the number of contexts. For example, two registers suffice for a four-context TM-FPGA. The average number of registers per programmable logic circuit may be less than the number of contexts. In fact, depending on the extent of partitioning, placing, and routing efficiencies and optimization involved, the average number of registers may be significantly less than the number of contexts. As an example, three registers may suffice for an eight-context TM-FPGA.

As noted above, the disclosed TM-FPGAs can provide area efficiencies compared to conventional approaches. Consider an N-context TM-FPGA, with f context registers. Assume that the TM-FPGA uses relatively simple context registers (no synchronous load, clear, reset, etc.). Assume further that each of the context registers uses about 2% of the TM-FPGA's core area. Using those assumptions, one may express the cost area, C, of the TM-FPGA as:

$$C = \left(\frac{N}{3} + \frac{2}{3} + f \cdot \frac{1}{48}\right).$$

In the above formula, the fractions $\frac{1}{48}$ and $N/3$ represent respectively the approximate contribution of the flip-flop area (about 2%) and the area taken up by configuration bits. The estimate is approximate, based on the empirical observation that control bits take up approximately one third of the area of an SRAM-based FPGA. The actual value varies slightly from one process technology to another, as well as from one implementation to another. As a result, one may express the die area ratio, R, between the TM-FPGA and a conventional FPGA as:

$$R = \frac{\left(\frac{N}{3} + \frac{2}{3} + \frac{f}{48}\right)}{N}.$$

Accordingly, one may express the area efficiency, E, as:

$$R = \frac{3}{\left(1 + \frac{2}{N} + \frac{f}{16N}\right)}.$$

Table 1 below expresses the efficiency, E, for various values of N and f.

TABLE 1

| N | f | E |
|---|---|---|
| 1 | 0 | 1.00 |
| 2 | 1 | 1.48 |
| 4 | 2 | 1.96 |
| 6 | 3 | 2.20 |
| 8 | 3 | 2.36 |
| 16 | 4 | 2.63 |
| ∞ | $\log_2(\infty)$ | 3.00 |

Generally, note that one may apply the inventive concepts effectively to various programmable logic circuitry or ICs known by other names in the art, as desired, and as persons skilled in the art with the benefit of the description of the invention understand. Such circuitry include devices known as programmable logic device (PLD), complex programmable logic device (CPLD), and programmable gate array (PGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A computer-implemented method of mapping an electronic circuit to resources in a time-multiplexed field programmable gate array (TM-FPGA), the method comprising:
   obtaining a representation of the electronic circuit from a user;
   using the computer to automatically partition the electronic circuit into a plurality of clusters; and
   using the computer to automatically assign each cluster in the plurality of clusters to a context of the time-multiplexed field programmable gate array (TM-FPGA).

2. The method according to claim 1, further comprising using the computer to automatically use a plurality of context registers to provide communication among a plurality of contexts of the time-multiplexed field programmable gate array (TM-FPGA).

3. The method according to claim 2, further comprising using the computer to automatically optimize the number of context registers used.

4. The method according to claim 3, further comprising using the computer to assign hardware resources to generate enable signals for the plurality of context registers.

5. The method according to claim 2, wherein automatically using a plurality of context registers to provide communication among a plurality of contexts of the time-multiplexed field programmable gate array (TM-FPGA) further comprises using the computer to assign each context register in the plurality of context registers to a respective cycle of a clock signal.

6. The method according to claim 5, wherein the clock signal comprises an internal clock signal of the time-multiplexed field programmable gate array (TM-FPGA).

7. The method according to claim 6, wherein the clock signal has a frequency equal to a frequency of a clock signal of the electronic circuit multiplied by the number of contexts in the plurality of contexts of the time-multiplexed field programmable gate array (TM-FPGA).

8. The method according to claim 4, wherein the generated enable signals for the plurality of context registers correspond to respective cycles of the clock signal.

9. The method according to claim 2, further comprising using the computer to determine whether the time-multiplexed field programmable gate array (TM-FPGA) includes a sufficient number of context registers to accommodate the electronic circuit.

10. The method according to claim 3, wherein automatically optimizing the number of context registers used further comprises using the computer to minimize the number of context registers used.

11. A computer-aided design (CAD) system for mapping an electronic circuit to resources in a time-multiplexed field programmable gate array (TM-FPGA), the CAD system comprising:
a computer, adapted to:
obtain a representation of the electronic circuit from a user;
partition automatically the electronic circuit into a plurality of clusters; and
assign automatically each cluster in the plurality of clusters to a context of the time-multiplexed field programmable gate array (TM-FPGA).

12. The CAD system of claim 11, wherein the computer is further adapted to automatically use a plurality of context registers to provide communication among a plurality of contexts of the time-multiplexed field programmable gate array (TM-FPGA).

13. The CAD system of claim 12, wherein the computer is further adapted to automatically optimize the number of context registers used.

14. The CAD system of claim 13, wherein the computer is further adapted to assign hardware resources to generate enable signals for the plurality of context registers.

15. The CAD system of claim 12, wherein to automatically use a plurality of context registers to provide communication among a plurality of contexts of the time-multiplexed field programmable gate array (TM-FPGA) the computer is further adapted to assign each context register in the plurality of context registers to a respective cycle of a clock signal.

16. The CAD system of claim 15, wherein the clock signal comprises an internal clock signal of the time-multiplexed field programmable gate array (TM-FPGA).

17. A non-transitory computer program product including computer-readable instructions, comprising:
a computer aided design (CAD) program adapted for processing by a computer to map an electronic circuit to resources in a time-multiplexed field programmable gate array (TM-FPGA), the CAD program adapted to cause the computer to:
obtain a representation of the electronic circuit from a user;
partition automatically the electronic circuit into a plurality of clusters; and
assign automatically each cluster in the plurality of clusters to a context of the time-multiplexed field programmable gate array (TM-FPGA).

18. The non-transitory computer program product of claim 17, wherein the CAD program is further adapted to cause the computer to automatically use a plurality of context registers to provide communication among a plurality of contexts of the time-multiplexed field programmable gate array (TM-FPGA).

19. The non-transitory computer program product of claim 18, wherein the CAD program is further adapted to cause the computer to automatically optimize the number of context registers used.

20. The non-transitory computer program product of claim 19, wherein the CAD program is further adapted to cause the computer to assign hardware resources to generate enable signals for the plurality of context registers.

* * * * *